(12) United States Patent
Van Reck (10) Patent No.: US 8,335,323 B2
(45) Date of Patent: Dec. 18, 2012

(54) METHOD OF AND A DEVICE FOR PROCESSING AUDIO DATA, A PROGRAM ELEMENT AND A COMPUTER-READABLE MEDIUM

(75) Inventor: Kristof Van Reck, Niel (BE)

(73) Assignee: NXP B.V., Eindhoven (NL)

( * ) Notice: Subject to any disclaimer, the term of this patent is extended or adjusted under 35 U.S.C. 154(b) by 1471 days.

(21) Appl. No.: 11/910,974

(22) PCT Filed: Apr. 4, 2006

(86) PCT No.: PCT/IB2006/051019
§ 371 (c)(1),
(2), (4) Date: Oct. 8, 2007

(87) PCT Pub. No.: WO2006/106479
PCT Pub. Date: Oct. 12, 2006

(65) Prior Publication Data
US 2008/0181428 A1    Jul. 31, 2008

(30) Foreign Application Priority Data
Apr. 8, 2005 (EP) .................................... 05102801

(51) Int. Cl.
*H03G 9/00* (2006.01)
(52) U.S. Cl. ......... 381/102; 381/312; 381/320; 381/321
(58) Field of Classification Search ................. 381/102, 381/312, 320, 321
See application file for complete search history.

(56) References Cited

U.S. PATENT DOCUMENTS

| | | |
|---|---|---|
| 4,185,168 A | 1/1980 | Graupe et al. |
| 4,454,609 A | 6/1984 | Kates |
| 4,508,940 A | 4/1985 | Steeger |
| 4,701,953 A | 10/1987 | White |
| 5,027,410 A | 6/1991 | Williamson et al. |
| 6,381,334 B1 | 4/2002 | Alexander |
| 6,731,767 B1 | 5/2004 | Blamey et al. |
| 2004/0264714 A1 | 12/2004 | Lu et al. |

*Primary Examiner* — Kimberly Rizkallah
*Assistant Examiner* — Errol Fernandes (57) ABSTRACT

A device (100) for processing audio data (101), wherein the device (100) comprises a mid-frequency filter unit (105) adapted to selectively filter a mid-frequency range component of the audio data (101) in such a manner that amplitudes of different frequency sub components of the mid-frequency range component of the audio data (101) are scaled so that the scaled amplitudes reflect relations between the original amplitudes of the different frequency sub-components.

22 Claims, 6 Drawing Sheets

METHOD OF AND A DEVICE FOR PROCESSING AUDIO DATA, A PROGRAM ELEMENT AND A COMPUTER-READABLE MEDIUM

FIELD OF THE INVENTION

The invention relates to a device for processing audio data.

Beyond this, the invention relates to a method of processing audio data.

Moreover, the invention relates to a program element.

Furthermore, the invention relates to a computer-readable medium.

BACKGROUND OF THE INVENTION

Electronic entertainment devices become more and more important. Particularly, an increasing number of users buy audio players and other entertainment equipment for use in a vehicle like a passenger car.

One feature of electronic entertainment devices according to the prior art is the opportunity for adjusting characteristics of an audible reproduction of audio data in a user-defined manner, for instance via a user-controllable volume control or a user-controllable equalizer. Such features are integrated in known audio players. According to the prior art, a user carries out equalizing in a car HiFi system manually.

US 2004/0264714 A1 discloses a method of audio normalization. When a request is received to play an audio file, volume normalization parameters may be retrieved from a media library or from the audio file and may be applied when playing the audio file.

OBJECT AND SUMMARY OF THE INVENTION

It is an object of the invention to provide a system for processing audio data that allows reproduction of audio content with a proper quality.

In order to achieve the object defined above, a device for processing audio data, a method of processing audio data, a program element and a computer-readable medium according to the independent claims are provided.

According to an exemplary embodiment of the invention, a device for processing audio data is provided, wherein the device comprises a mid-frequency filter unit adapted to selectively filter a mid-frequency range component of the audio data in such a manner that amplitudes of different frequency sub-components of the mid-frequency range component of the audio data are scaled so that the scaled amplitudes reflect relations between the original amplitudes of the different frequency sub-components.

Furthermore, according to another exemplary embodiment of the invention, a method of processing audio data is provided comprising the step of selectively filtering a mid-frequency range component of the audio data in such a manner that amplitudes of different frequency sub-components of the mid-frequency range component of the audio data are scaled so that the scaled amplitudes reflect relations between the original amplitudes of the different frequency sub-components.

Beyond this, according to another exemplary embodiment of the invention, a computer-readable medium is provided, in which a computer program of processing audio data is stored, which computer program, when being executed by a processor, is adapted to control or carry out the above-mentioned method step.

Moreover, a program element of processing audio data is provided according to still another exemplary embodiment of the invention, which program element, when being executed by a processor, is adapted to control or carry out the above-mentioned method step.

Processing audio data according to the invention can be realized by a computer program, that is to say by software, or by using one or more special electronic optimization circuits, that is to say in hardware, or in hybrid form, that is to say by means of software components and hardware components.

The characterizing features according to the invention particularly have the advantage that a mid-range frequency filter unit may be provided which may act as a kind of equalizer particularly operating in a range of mid-frequency audio data. This filter may be capable of individually scaling—particularly downscaling—sub-components (for instance sub-bands or single frequencies) in this mid-frequency range in a manner that scaled amplitudes reflect relations between the original amplitudes of the different frequency sub-components. That is to say, original amplitude differences between sub-components may be at least partially preserved in the modified amplitudes. Thus, amplitude relations between different sub-components may be considered by the rescaling scheme, allowing maintaining sound characteristics of the original mid-frequency audio data while simultaneously tailoring the mid-frequency range in a manner to improve the sound quality.

The scaling scheme according to an exemplary embodiment of the invention may ensure that a mid-frequency range is kept within particular predetermined amplitude ranges. Optionally, frequency regions differing from the mid-frequency domain may or may not be filtered according the same or another filtering scheme. The rescaling in the mid frequency range may be performed in such a manner as to maintain the proportions between the original amplitudes in sub-components of this frequency range.

Thus, a smooth and efficient mid-range filter algorithm is provided according to an exemplary embodiment of the invention which may be capable of achieving a proper listening quality and a natural sound when the automatically equalized audio content is replayed. A filtering algorithm may be realized with a reasonably low computational burden. Sound resulting from the processed audio data may have natural characteristics, since original amplitude relations in different mid-range sub-portions may be at least partially maintained.

Auto equalizing using mid-range boost compression, particularly with linear scaling, may be realized according to an exemplary embodiment of the invention. Particularly, this may allow to perform equalizing in a car HiFi system in an automated and high quality manner.

According to one aspect of the invention, audio data to be reproduced by a speaker system may be processed according to an equalizing algorithm that may manipulate the audio data to improve the listening quality. According to such an algorithm, a filter may be calculated that needs to be inserted in a signal path to allow a proper sound quality at a listening position. This filter may then be modified individually for different frequency ranges of the audio data.

Particularly, a correction in the mid-range may be carried out. The term "mid-range" may particularly denote a middle band of audio frequencies and may cover frequencies between, for instance, about 310 Hz and about 8 kHz, more particularly in the range between 700 Hz and 4 kHz. A mid-range of frequencies may also be defined from an original frequency spectrum by dividing the latter in a low-frequency domain (which may, if desired, be further divided into two sub-ranges), a mid-frequency domain and high frequency domain. In other words, the term mid-range frequencies may be defined as a frequency range sandwiched between a low-frequency domain and a high-frequency domain. The mid-frequency domain may then be treated according to a separate filter algorithm, as compared to lower and higher frequencies.

According to U.S. Pat. No. 6,381,334 B1, a mid-range frequency band may particularly cover frequencies between 500 Hz and 5 kHz.

The mid-range correction according to an embodiment of the invention may simply set the entire mid-range to a constant boost target level (for instance 3 dB). However, a more refined solution may also limit mid-range boost levels, but may preserve mutual proportions between different mid-range frequency sub-bands. An even more refined solution may linearly scale a downscaling factor over the mid-range area.

Optionally, in addition to the mid-range filtering, bass (low-frequency) and treble (high-frequency) bands may be optimized as well. For very low-frequencies in the bass range, a cut can be performed. Higher bass frequencies may be conditioned to a boost limit (for instance 8 dB). Treble frequencies may be fixed to a constant value (for instance 3 dB for front speakers of a car sound system and −3 dB for rear speakers of a car sound system).

According to exemplary embodiments of the invention, auto equalizing in a small volume car compartment with high-reflecting surfaces is enabled. In such an acoustical environment, a sound field may be heavily affected by a strange position of the sound source. Particularly for mid-range frequencies, a well-balanced and bright sound may be obtained.

An exemplary field of applications of the system according to the invention is a speaker system in a limited compartment, for instance a car compartment.

According to one aspect of the invention, an auto equalizer with mid-range boost compression preserving mutual proportionality and linear scaling is provided. Thus, an audio equalizer may be provided boosting the mid-range using linear scaling techniques.

The mid-range boost compression scheme according to an exemplary embodiment of the invention may operate on spectral data (and does, according to an exemplary embodiment of the invention, not operate on time domain data) and does not primarily have the goal to increase the volume by preventing clipping. In contrast to this, a goal according to the system of the invention is to make an equalized sound while preserving mutual proportionality between FFT (Fast Fourier Transformation) bins, that is to say spectral bands.

According to the invention an automatic speaker equalization is allowed, particularly automatic mid-range boost compression. Thus, a sound reproduced by speakers (for instance loudspeakers) may be significantly improved.

The system according to an exemplary embodiment of the invention may thus allow automatic equalization, particularly in a car. For this purpose, a filter may be adapted to treat different frequency domains in an individual and different manner. For determining the parameters of a filter, sound may be measured in the acoustic environment in which the system shall be implemented, and a filter adaptation may be performed by the system so that the sound may be equalized. The filter of the device according to the invention may be adjusted for a driver position in a car, or for a position of a co-driver. Alternatively, it may be possible to perform the filter adaptation by interpolation of all positions of all passengers in a car so that a filter may be obtained which provides, in average, an optimized sound for all passengers of a car, compromising between different requirements.

One possibility is that a car manufacturer measures the acoustical characteristics inside a car and performs a filter calculation once. Then, this calculated and optimized filter may be implemented in a car, without changing the filter configuration again. Alternatively, an audio system in a car may provide a user with the opportunity to adjust filter parameters as default values. For this purpose, a user may be guided through an adjustment procedure, for instance via a user interface in which the user may input desired value for parameters of frame conditions. Then, the filter calculation may be carried out under consideration of user-defined specifications. Moreover, the user can, if desired, repeat the filter optimization procedure, for instance to adjust the filter parameters to modified frame conditions. According to another exemplary embodiment of the invention, a system may be provided in which microphones detect the sound at one or more particular positions in a car, for instance close to driver position, and performs an online or real-time adaptation of the filter parameters in a self-adaptive manner.

Referring to the dependent claims, further exemplary embodiments of the invention will be described.

Next, exemplary embodiments of the device for processing audio data will be described. These embodiments may also be applied for the method of processing audio data, for the computer-readable medium and for the program element.

In the device, the mid-frequency filter unit may be adapted to selectively filter the mid-frequency range component of the audio data in such a manner that the amplitudes of the different frequency sub-components of the mid-frequency range component of the audio data are downscaled so that the downscaled amplitudes reflect relations or proportions between the original amplitudes of the different frequency sub-components. In other words, by downscaling mid-frequency ranges, it may be avoided that mid-frequency audio components are over-exaggerated which could result in a bad or strange sound. Therefore, the described embodiment realizes both, a limitation of mid-frequency component amplitudes and the maintenance of relations between different sub-frequency bands in the mid-range domain.

According to another embodiment, the mid-frequency filter may be adapted to selectively filter the mid-frequency range component of the audio data in such a manner that the amplitudes of ⅓ octave bands as the different frequency sub-components of the mid-frequency range component of the audio data are scaled so that the scaled amplitudes reflect relations between the original amplitudes of the ⅓ octave bands. By dividing each octave in three bands, a sufficiently fine but, for the processing resources, acceptable complexity of the mid-range filtering is obtained. This may allow also a real time processing and self-adaptive up dating of filter parameters. Taking this measure allows both, a fast calculation procedure and a sufficiently refined analysis. However, although the selection of ⅓-octave is sufficiently fine with acceptable complexity, this selection could certainly be finer or coarser, if desired or necessary.

Furthermore, the mid-frequency filter unit may be adapted to selectively filter the mid-frequency range component of the audio data in such a manner that the amplitudes of the different frequency sub-components of the mid-frequency range component of the audio data are scaled preserving proportions between the amplitudes of the different frequency sub-components. By preserving proportions or relative intensity ratios between different sub-bands, it is possible that the sound is not modified too much from the original sound so that the acoustical experience of a listener is not deteriorated.

Beyond this, the device may comprise a scaling unit adapted to calculate a scaling factor for scaling the amplitudes of the different frequency sub-components of the mid-frequency range component of the audio data by estimating maximum amplitude of the different frequency sub-components and based on the estimated maximum amplitude and a predetermined threshold value indicating an upper amplitude limit. In this context, it may be first determined which of the different mid-range frequency sub-bands has the highest audio amplitude. Then, this highest amplitude may be compared to a maximally allowable threshold value, and if the latter is exceeded, the amplitudes are reduced to ensure that the rescaled amplitudes do not exceed the predetermined threshold value. Such a downscaling factor may then be taken for all frequency sub-bands of the mid-range domain to downscale them, however maintaining original proportions.

Still referring to the previously described embodiment, the mid-frequency filter unit may be adapted to selectively filter the mid-frequency range component of the audio data in such a manner that the amplitudes of all the different frequency sub-components of the mid-frequency range component of the audio data are downscaled in accordance with the calculated scaling factor. In other words, the scaling factor may be applied to downscale all different mid-frequency sub-band components accordingly.

Particularly, the mid-frequency filter may be adapted to selectively filter the mid-frequency range component of the audio data in such a manner that the amplitudes of the different frequency sub-components of the mid-frequency range component of the audio data are downscaled logarithmically in accordance with the calculated scaling factor.

Furthermore, the device may optionally comprise a scaling-factor adjustment unit which may be adapted to adjust the previously calculated scaling factor for each of the different frequency sub-components individually. In other words, after having calculated a basic common scaling factor, the latter may be adjusted for each sub-frequency band in the mid-range domain individually to further improve the subjective quality of the processed audio data when being reproduced, and to refine the analysis.

Particularly, the scaling factor adjustment unit may be adapted to adjust the calculated scaling factor by linearly scaling the calculated scaling factor for the different frequency sub-components. Such a linear scaling technique takes the frequency of the sub-bands as a parameter which influences the value of the adjusted scaling factor in a particular sub-domain.

For instance, the scaling factor adjustment unit may be adapted to adjust the calculated scaling factor so that the adapted scaling factor may be higher for a first frequency sub-component than for a second frequency sub-component, wherein the first frequency sub-component may include higher frequencies than the second frequency sub-component. According to this embodiment, the higher the frequency of a sub-range, the larger may be the scaling factor. Particularly, the adjusted scaling factor may depend linearly on the frequency of each of the sub-ranges.

Furthermore, the mid-frequency filter unit may be adapted to selectively filter a component of audio data in the frequency range between about 0.3 kHz and about 8 kHz as a mid-frequency range. However, the indicated frequency ranges are only exemplary and may be extended to smaller frequencies or larger frequencies.

The device according to an exemplary embodiment of the invention may further comprise a high-frequency filter unit which may be adapted to selectively filter a high-frequency range component of the audio data in such a manner that amplitudes of different frequency sub-components of the high-frequency range component of the audio data are fixed to a constant predetermined value. That is to say, all frequency contributions above the mid-range may be set to a fixed amplitude value. A reason for this may be that, at high frequencies of for instance more than 8 kHz, there is in many cases no need to have a balanced correction to level out coloring. Therefore, a relatively hard limit may be imposed to these boost levels. This scheme may allow to calculate high-frequency corrected values with low computational burden, thus in a very fast manner.

The high-frequency filter unit may particularly be adapted to selectively filter a component of the audio data in the frequency range above the mid-frequency range. Particularly, the high-frequency domain may cover all frequency contributions above about 8 kHz.

Additionally or alternatively, the device may comprise a very-low-frequency filter unit adapted to selectively filter a very-low-frequency range component of the audio data in such a manner that the very-low-frequency range component is cut. Very low-frequencies, for instance frequencies below about 40 Hz, may be not reproducible by a loudspeaker system. Thus, these frequency values may be simply filtered out. Therefore, it may be possible to omit any very low-frequency filter in a signal path.

The very-low-frequency unit particularly may be adapted to selectively filter out a component of the audio data in the frequency range below about 40 Hz.

According to another exemplary embodiment of the invention, the device may comprise a low-frequency filter unit adapted to selectively filter a low-frequency range component of the audio data in such a manner that the very low-frequency range component is conditioned in a manner that amplitudes not exceeding a predetermined maximum threshold remain unchanged, and amplitudes exceeding the predetermined maximum threshold are reduced to the maximum threshold. Such a low-frequency filter unit, which may be adapted for filtering or manipulating frequency contributions between the very-low-frequency range and the mid-frequency range (for instance between 40 Hz and 310 Hz) may remain uninfluenced by the filtering process provided that a maximum amplitude is not exceeded. However, if this is the case, then the amplitude is restricted to a predetermined value.

The device according to the invention may further comprise a reproduction unit for reproducing the processed audio data. In other words, input audio data may be provided to the device, may be processed by the filters and may then be supplied to the reproduction unit as processed output audio data for reproducing the processed audio data in a way to become audible for a human listener. Thus, the means for reproducing the processed audio data may be loudspeakers, or headphones.

A main field of application of the system according to the invention is processing audio data. However, the system can be embedded in a scenario in which, in addition to the audio data, additional data are processed, for instance related to visual content. Thus, the invention can be realized in the frame of a video data processing system.

The device according to the invention may be realized as one of the devices of the group consisting of a vehicle audio system, a portable audio player, a portable video player, a head mounted display, a mobile phone, a DVD player, a CD player, a harddisk-based media player, an internet radio device, a public entertainment device and an MP3 player. The term "vehicle audio system" may particularly denote any audio system being mounted or being adapted for mounting in any kind of vehicle, for instance in a car, a van, a truck, a ship, a plane, or a train. However, a preferred field of application is a passenger car in which special acoustical conditions may be present that may be handled particularly well with the system according to the invention. Although the mentioned devices relate to the main fields of application of the invention, any other application is possible.

The aspects defined above and further aspects of the invention are apparent from the examples of embodiment to be described hereinafter and are explained with reference to these examples of embodiment.

DESCRIPTION OF EMBODIMENTS

The illustration in the drawing is schematically. In different drawings, similar or identical elements are provided with the same reference signs.

In the following, referring to FIG. 1, a schematic view of a device 100 for processing input audio data 101 according to an exemplary embodiment of the invention will be described.

The device 100 comprises a storage unit 102 in which audio content to be replayed is stored, including the input audio data 101. In the present case the storage unit 102 is designed for being inserted in a CD player. However, storage unit 102 may be a harddisk on which MP3 files are stored, or the like.

The input audio data 101 is provided to filter units for obtaining output audio data 109. The filter units in particular are an optional very low-frequency filter unit 103, a low-frequency filter unit 104, a mid-frequency filter unit 105 and a high-frequency filter unit 106.

The very low frequency filter unit 103 is adapted to selectively filter frequency contributions of the input audio data 101 with frequencies below 40 Hz in such a manner that these very low frequency contributions are cut, that is to say eliminated. Since this very low frequency range component will, in many cases, not contribute significantly to the output audio data 109 (since a loudspeaker 110 may be not capable of reproducing audio contributions in this frequency range), the very low-frequency filter unit 104 may simply be skipped in FIG. 1. However, in another scenario, in which a reproduction unit is provided which allows reproducing also very low frequency contributions or when a contribution in the very low-frequency range shall be implemented in the output audio data 109, then this very low-frequency filter unit 103 can be adjusted accordingly.

The low-frequency filter unit 104 may be adapted to selectively filter a component of the input audio data 101 in a frequency range between 40 Hz and 310 Hz. In this frequency domain, the low-frequency filter unit 104 may selectively filter this low-frequency range component of the input audio data 101 in such a manner that the low-frequency range component is conditioned. In more detail, these contribution may be maintained constant, when its amplitudes does not exceeding a maximum threshold of, for instance, 8 dB, but may be reduced to the maximum threshold of 8 dB when amplitudes of this contribution exceed the maximum threshold.

Figure 1:
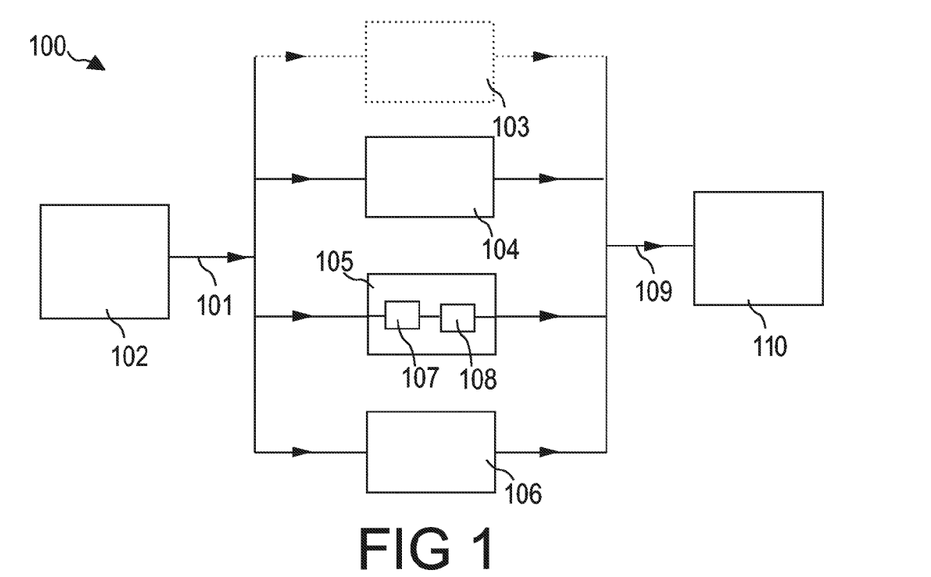
FIG. 1 illustrates a schematic view of one embodiment of a device for processing input audio data.

Furthermore, FIG. 1 shows the mid-frequency filter unit 105 which is adapted to selectively filter a mid-frequency range component of the input audio data 101, particularly a contribution in a frequency range between 310 Hz and 8 kHz, in such a manner that amplitudes of different frequency sub-components of the mid-frequency range component of the input audio data 101 are scaled so that the scaled amplitudes reflect relations or proportions between the original amplitudes of the different frequency sub-components. For instance, the mid-frequency may be divided into a predetermined number of sub-bands or intervals, for instance into fifteen (15) intervals. Then, the amplitude in the fifteen (15) intervals may be (down-)scaled so that their original relation is generally maintained. For this purpose, the mid-range frequency band may be divided into ⅓-octave bands, and the downscaling may be carried out so that proportions between the amplitudes of the different frequency sub-components may be preserved.

Particularly, the mid-frequency filter unit 105 may comprise a scaling unit 107 which may be adapted to calculate a scaling factor for scaling the amplitudes of the different frequency sub-components of the mid-frequency range component of the input audio data 101 based on a maximum amplitude of the different frequency sub-components and based on a predetermined threshold value indicating an upper amplitude limit. For instance, it is estimated which of the fifteen (15) frequency bands has the highest amplitude. This amplitude is then downscaled by a particular downscaling factor that can be determined based on the ratio between the predetermined threshold value and the estimated maximum amplitude.

Then, a scaling-factor adjustment unit (108) may further adjust the scaling factor (which may be four (4), for instance) so that the calculated scaling factor is adjusted for each of the fifteen (15) frequency sub-components individually. This may be particularly performed by linearly scaling the calculated scaling factor for the different frequency sub-components. This procedure will be described in more detail below.

The high-frequency filter unit 106 is adapted to selectively filter a high-frequency range component of the audio data 101, for instance frequencies above 8 kHz, in such a manner that amplitudes of different frequency sub-components of the high-frequency range component of the audio data 101 are fixed to a constant predetermined value, for instance 3 dB.

The contributions filtered by the filter unit 103 to 106 may be summed up and may be provided as output audio data 109 to a loudspeaker 110 which may then reproduce the processed audio data 109 in an audible manner, for instance in a car environment.

In the following, an exemplary embodiment of a system according to the invention will be described in more detail referring to FIG. 2 to FIG. 16.

According to one aspect of the invention, an algorithm is provided that has been designed to auto-equalize a speaker system. This can be implemented for use in a car compartment, but it is not limited to this application. Herein, the sound field may be heavily affected by a strange position of the sound sources. Furthermore, the small volume of the compartment and the fact that some surfaces may be highly reflecting may produce evident resonance that may cause large alternations of the frequency response.

Figure 2:
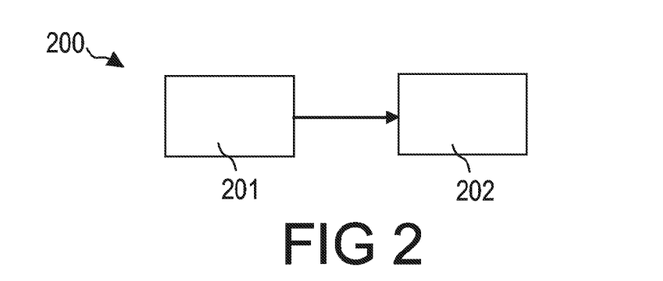
FIG. 2 illustrates one embodiment of an algorithm for use with the device of FIG. 1.

In the following, referring to FIG. 2, an algorithm 200 according to an exemplary embodiment of the invention will be described schematically.

The algorithm 200 comprises two parts, namely a measurement and measurement conditioning part 201 and a subsequent inverse filter calculation and filter conditioning part 202.

First, the measurement and measurement conditioning part 201 will be described in more detail.

Per channel, a white noise signal sampled at 48 kHz may be played through the corresponding speaker and may be recorded via a microphone at a listening position. The recordings may be passed through a further part of the algorithm 200, which may filter them through a second order Butterworth high-pass filter with cut-off at 40 Hz to remove direct current (DC) contributions. After this, the time delay between the generation of the noise and the first useful samples to be interpreted may be estimated. Samples being not representative may be removed.

In the following, the inverse filter calculation and filter conditioning part 202 will be described in more detail.

First, an FFT (Fast Fourier Transformation) and reference calculation may be carried out.

Per channel (for instance four in a normal car), the Fast Fourier Transformation (FFT) may be calculated. The FFT length may be set at 16.384 points. This frequency resolution (±3 Hz) may be needed to have a decent low-end accuracy.

Figure 3:
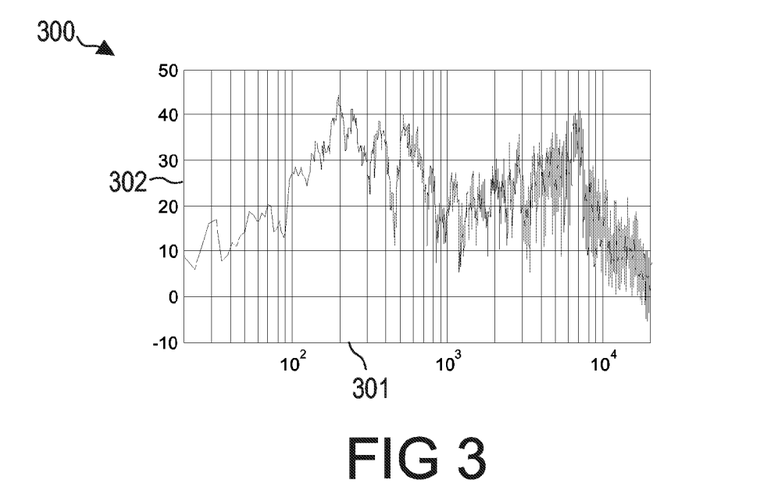
FIG. 3 illustrates a diagram of one embodiment of a Fast Fourier Transform (FFT) of a transfer function for an input channel.

FIG. 3 shows a diagram 300 illustrating the FFT of the transfer function "left front speaker—microphone at drivers position".

Along an abscissa 301 of the diagram 300, the frequency is plotted on a logarithmic scale in Hz. Amplitude in dB is plotted along an ordinate 302 of the diagram 300.

To determine a reference (for instance 0 dB), the FFT may be scaled with the mean of the energy between 50 Hz and 1000 Hz. The energy in this frequency band may be independent of the microphone position around the head.

Figure 4:
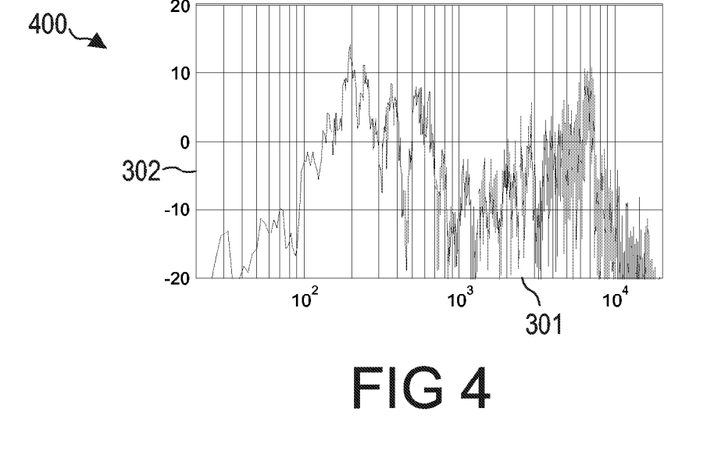
FIG. 4 illustrates a diagram of one embodiment of a scaled transfer function for the input channel of FIG. 3.

FIG. 4 shows a diagram 400 illustrating a scaled transfer function "left front speaker—drivers position".

The relatively big FFT length needed for an accurate low-end resolution also implies an accurate and unnecessary high-end resolution. An equalizing filter with a large high-end resolution may cause inevitable "ringing" because of sharp peaks that may occur. Therefore, the FFT may be divided into ⅓ octaves ranging from 25 Hz to 20 kHz. The first ⅓-octave values may be 25 Hz, 31.5 Hz, 40 Hz, 50 Hz and 63 Hz. This may explain why a frequency resolution of 3 Hz may be appropriately chosen before.

Figure 5:
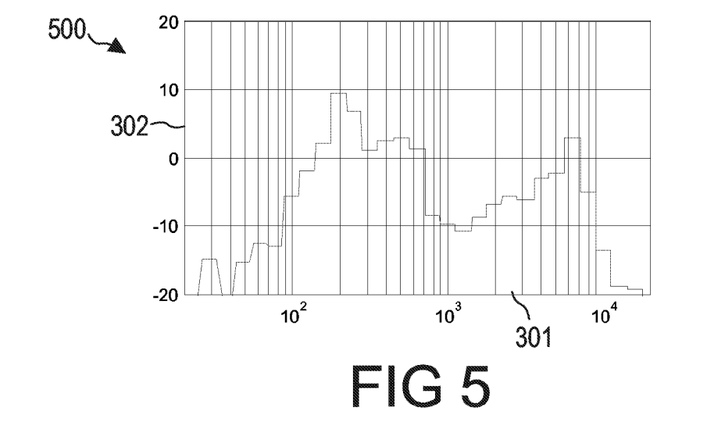
FIG. 5 illustrates a diagram of one embodiment of the scaled transfer function of FIG. 4 in ⅓-octave bands.

FIG. 5 shows a diagram 500 illustrating a scaled transfer function "left front speaker—microphone" in ⅓-octave bands.

In the following, inverse filter calculation will be described in more detail.

The filter that needs to be inserted in the signal part to have a flat response at the listening position may be the inverse of the transfer function, see FIG. 5.

Figure 6:
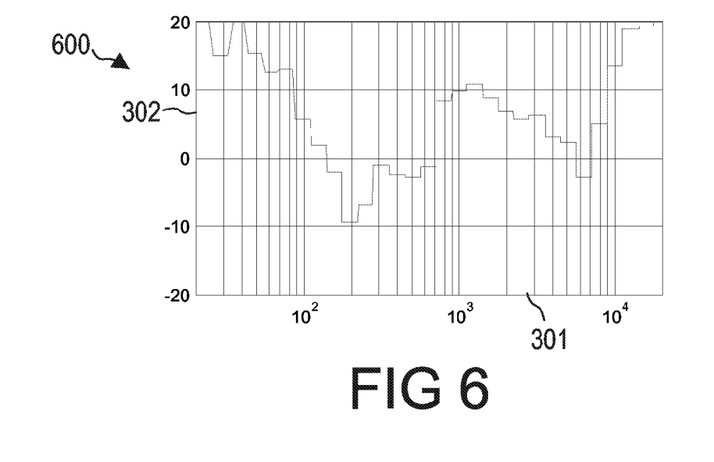
FIG. 6 illustrates a diagram of one embodiment of a raw inversion of the scaled transfer function of FIG. 5.

This "raw" inversion is displayed in FIG. 6 illustrating a diagram 600.

Next, a low-frequency correction will be described.

The filters 103, 104 in FIG. 1 may realize this low-frequency correction. However, the very low-frequency filter 103 can be omitted from the signal path, since an equalization filter does not have to boost frequencies that a loudspeaker system is not able to reproduce. Instead of this, the signal may be cut in the 25 Hz, 31.5 Hz and 40 Hz bands by 12 dB. This may provide extra headroom to the signal. Depending on the loudspeaker response that needs to be equalized, more or less low-frequency bands need to be cut. Also, large boost levels need to be reduced, to avoid distortion. The maximum bass boost level may be adjusted. Per default, the value may be set to 8 dB and may limit the bass boost till 250 Hz.

Figure 7:
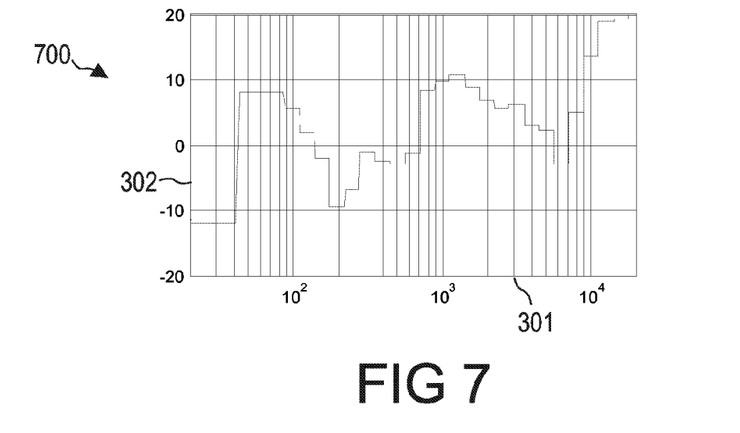
FIG. 7 illustrates a diagram of one embodiment of the raw inversion of FIG. 6 with bass boost conditioning.

The result of the bass conditioning is displayed in FIG. 7 illustrating a diagram 700 showing bass boost conditioning.

Next, a mid-range correction will be explained.

FIG. 7 shows a large mid-range boost in the frequency domain between about 700 Hz and about 4 kHz, which should be avoided. A straightforward solution would be to hard limit the boost level. Listening tests proof that the level should be maximally 3 dB. Now, the filter is a simple mid-range boost instead of an equalizing filter. This is shown in a diagram 800 of FIG. 8.

Figure 8:
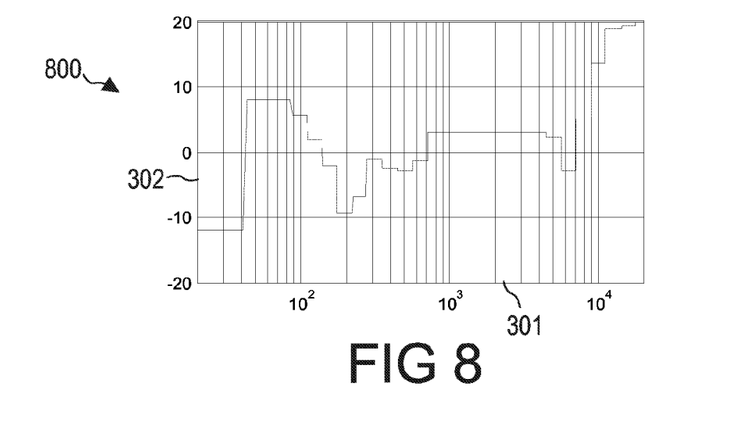
FIG. 8 illustrates a diagram of one embodiment of the signal of FIG. 7 with a hard limit for a mid-range area.

In other words, FIG. 8 shows the diagram 800 showing hard limiting the mid-range in the domain between 700 Hz and 4 kHz.

The sound may now be brighter but may be not very balanced. Theoretically, the goal of equalizing is to achieve a flat transfer function at the listening position. This can often not be achieved due to the large boost levels. Particularly, equalizing may level out amplitude differences of adjacent frequencies or frequency bands with subtle corrections.

Figure 9:
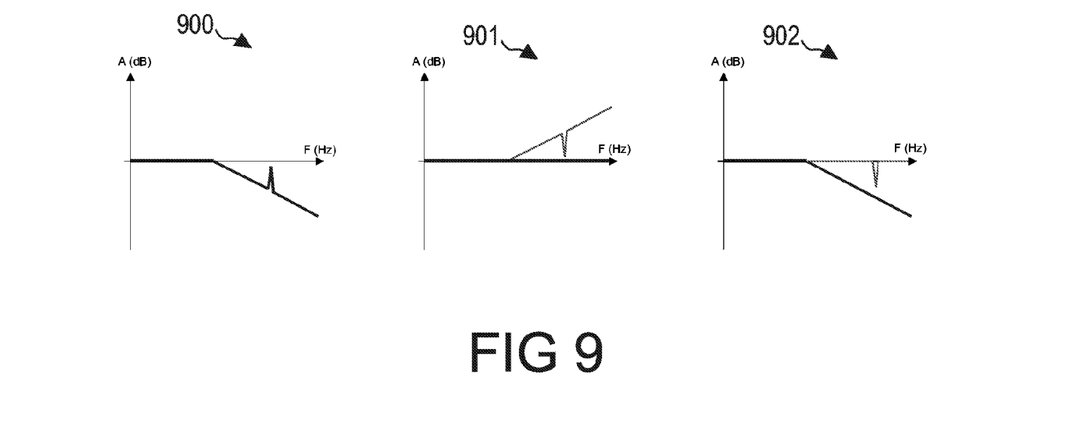
FIG. 9 illustrates diagrams of one embodiment of various equalizations and corresponding transfer functions.

This is illustrated in FIG. 9 depicting theoretical versus practical equalizing.

FIG. 9 shows a first diagram 900 illustrating an original transfer function.

A second diagram 901 relates to theoretical equalization and illustrates a transfer function.

A third diagram 902 shows practical equalization and illustrates a transfer function.

In the following, mid-range boost compression preserving mutual proportionality will be described.

A special system has been prepared that limits (particularly compresses) mid-range boost levels by preserving mutual proportions between ⅓-octave bands. This procedure may be automated and will be described in the following.

The maximum (mid-range) boost may be searched in the bands between 310 Hz and 8 kHz. This maximum may be compared to a target value that is standard set to 3 dB to find a downscaling factor for the whole mid-range area.

For example, referring to FIG. 7, the maximum mid-range boost is 12 dB (1.25 kHz). The downscaling factor may be calculated as 12/3=4.

Now, the whole mid-range area may be downscaled with this factor in a logarithmic manner. This is in fact compression on the boost level, because a division in logarithmic domain may correspond to an n-th power root in linear domain.

Big boosts may be reduced much more than small boosts while preserving mutual proportionality: 24 dB (16) becomes 6 dB (2), 6 dB (2) becomes 1.5 dB (1.2).

Figure 10:
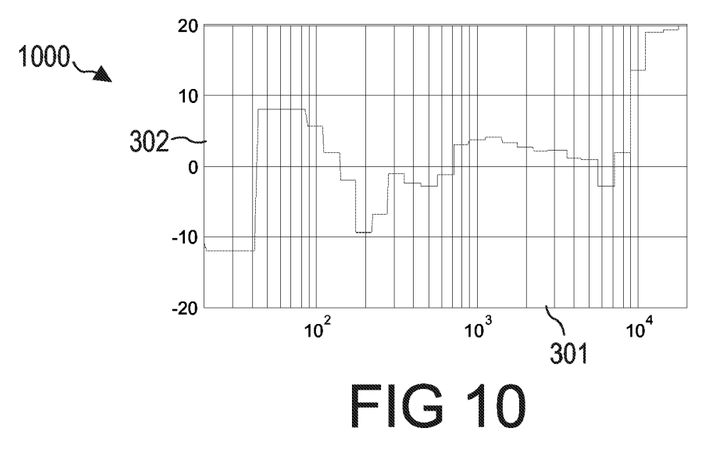
FIG. 10 illustrates a diagram of one embodiment of the signal of FIG. 7 with mid-range scaling.

A diagram 1000 shown in FIG. 10 shows results of the mid-range scaling, as described.

However, the mid-range boost compression or mid-range correction according to FIG. 10 can be further optimized, particular because of the following two reasons:

Firstly, the 310 Hz band may be scaled, while the 250 Hz band is not. Suppose that the 250 Hz and 310 Hz bands need to be boosted by 10 dB. Because of the mid-range scaling, the 310 Hz may be scaled for example to 2.5 dB. Then, the difference in transition boost level may be too big.

Secondly, perceptional, the low mid band can be boosted more than the high mid band before sounding aggressive. Therefore, it may be not necessary to reduce the low mid boost level as much as the high mid boost level, in this way obtaining a "flatter" sound.

In the following, mid-range boost compression with linear scaling will be described.

Because of the aspects explained above, a regulating system may be introduced which may be capable of linearly scaling the downscaling factor over the mid-range area. The mid-range area may be set between 310 Hz and 8 kHz, which contains a total of 15 frequency bands (310 Hz to 400 Hz, 400 Hz to 500 Hz, 500 Hz to 630 Hz, . . . , 5000 Hz to 6300 Hz, 6300 Hz to 8000 Hz).

The original downscaling factor may be adapted to a band using the following formula:

"Downscaling factor per band=1+(Downscaling factor−1)*band number/number bands"

Assuming a fixed downscaling factor of 4, this results in the following:

For the 310 Hz band, the downscaling factor becomes 1+(4−1)*1/15=18/15

For the 400 Hz band, the downscaling factor becomes: 1+(4−1)*2/15=21/15

For the 8 kHz band, the downscaling factor becomes 1+(4−1)*15/15=60/15=4.

The 310 Hz band may be scaled down, but not much. In this way, the original transition from the 250 Hz band may stay almost unchanged. Also, the high mid band may be boosted less than the low mid band, which may result in a less aggressive sound.

This means that the original target value can only be reached as the nominal maximum boost occurred at 8 kHz because it is there that the downscaling factor reaches its full magnitude. Practically, most speaker systems may have a natural roll-off towards higher frequencies, so the chance that the maximum boost level will occur at these higher frequencies is quite big. So in general, the obtained maximum boost level for the high mid band will not differ much from the postulated target value.

Figure 11:
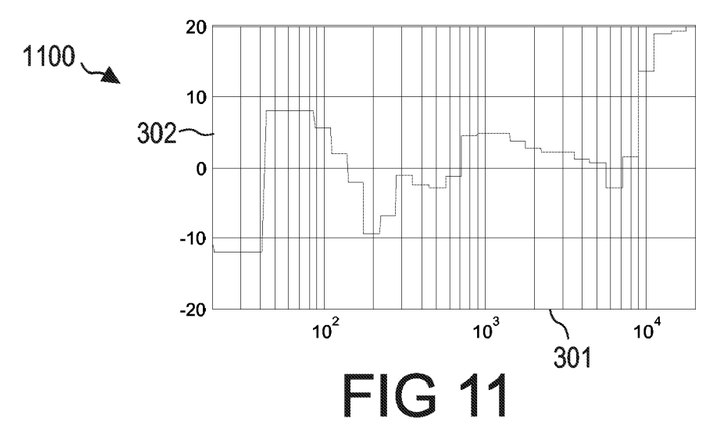
FIG. 11 illustrates a diagram of one embodiment of the mid-range scaling of FIG. 10 with further linear scaling across the mid-range area.

FIG. 11 shows a diagram 1100 illustrating mid-range compression with linear scaling.

It may be not very easy to visually compare FIG. 11 and FIG. 10 because there is no boost below 700 Hz (cuts are not compressed and stay thus unchanged).

Figure 12:
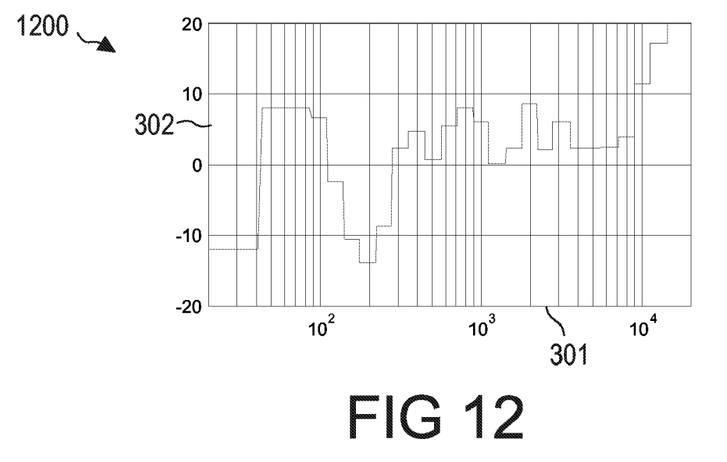
FIG. 12 illustrates a diagram of another embodiment of a signal without mid-range compression.
Figure 13:
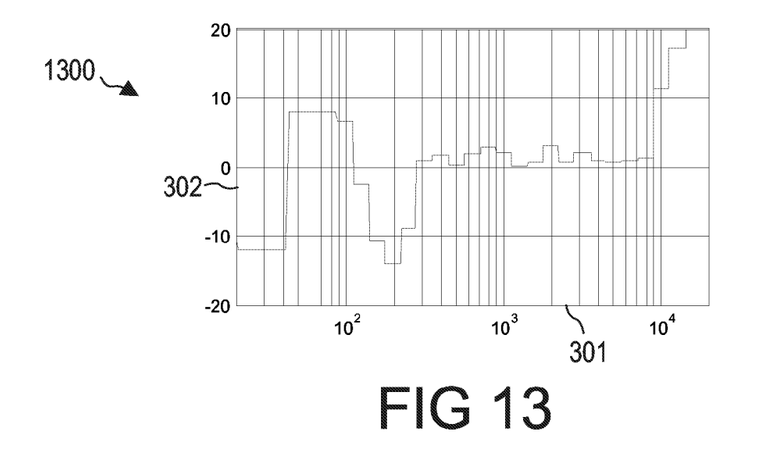
FIG. 13 illustrates a diagram of one embodiment of the signal of FIG. 12 with mid-range compression.
Figure 14:
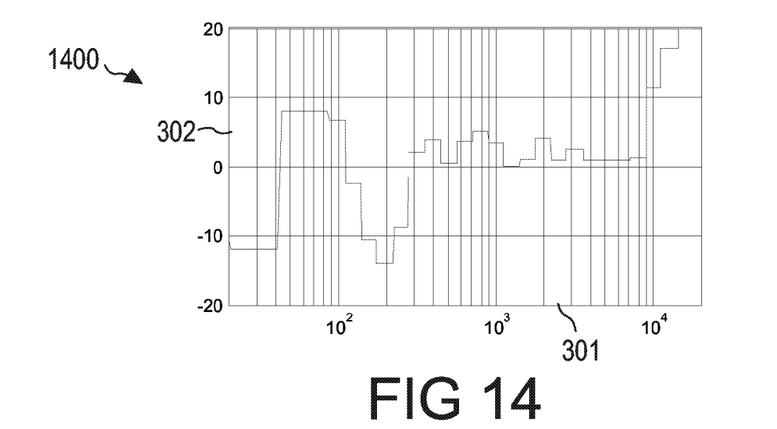
FIG. 14 illustrates a diagram of one embodiment of the signal of FIG. 12 with mid-range compression with further linear scaling across the mid-range.

Therefore, the plots according to FIG. 12 to FIG. 14 show an example of the influence of linear scaling on the low mid bands. The original filter is derived from the right channel transfer function measurement.

Particularly, FIG. 12 shows a diagram 1200 without mid-range compression.

Without mid-range compression, the sound may be aggressive (big boost levels).

FIG. 13 shows a diagram 1300 illustrating mid-range compression.

With mid-range compression, the high mid-sounds may be well balanced, but the low mid-sounds may be still improvable.

In the following, referring to FIG. 14, a diagram 1400 illustrating mid-range compression with linear scaling will be described.

With mid-range compression and linear scaling, the optimum mid-range equalization may be achieved. Maximally flat sound in the low mid-sounds may be achieved because at the compression preserving the mutual proportionality, with a perfect crossover towards the bass (boost). In the high mid-sounds, peaks and dips are leveled out on the subtle and proportional way due to the linear scaling, resulting in a well-balanced, not aggressive sound. Frequency cuts may stay unchanged.

In the following, referring to a diagram 1500 shown in FIG. 15, high-frequency correction will be described.

Above 8 kHz, there may be a need to have a balanced correction to level out coloring. Therefore, a hard limit may be imposed on these boost levels. A small boost above 8 kHz can dramatically broaden the stereo image. Because in the car, the front speakers play the same as the rear speakers for normal stereo, a fixed treble boost may be put on the front channels (if necessary) and a fixed cut may be put on the rear channels. This may pull the sound image in front of the listener.

The boost in the front channel may be fixed to +3 dB, and the cut on the rear channels may be fixed to −3 dB (giving a difference of 6 dB between the front and rear channels).

Figure 15:
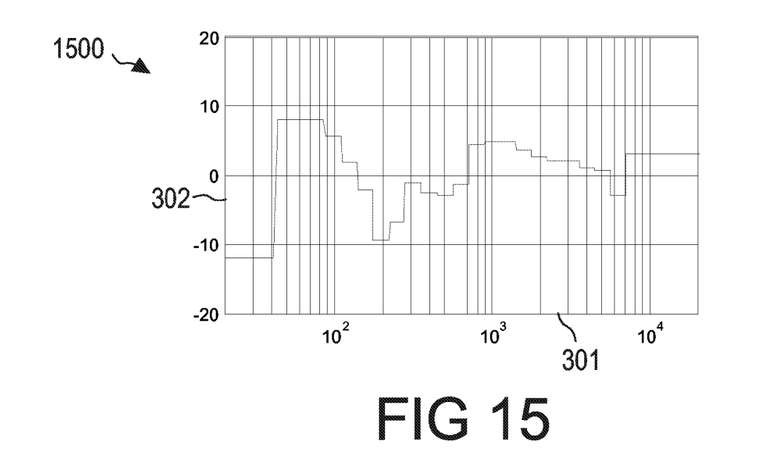
FIG. 15 illustrates a diagram of one embodiment of a signal to illustrate high-frequency correction.

The diagram 1500 shown in FIG. 15 shows the described high-frequency correction (for the front channel).

Figure 16:
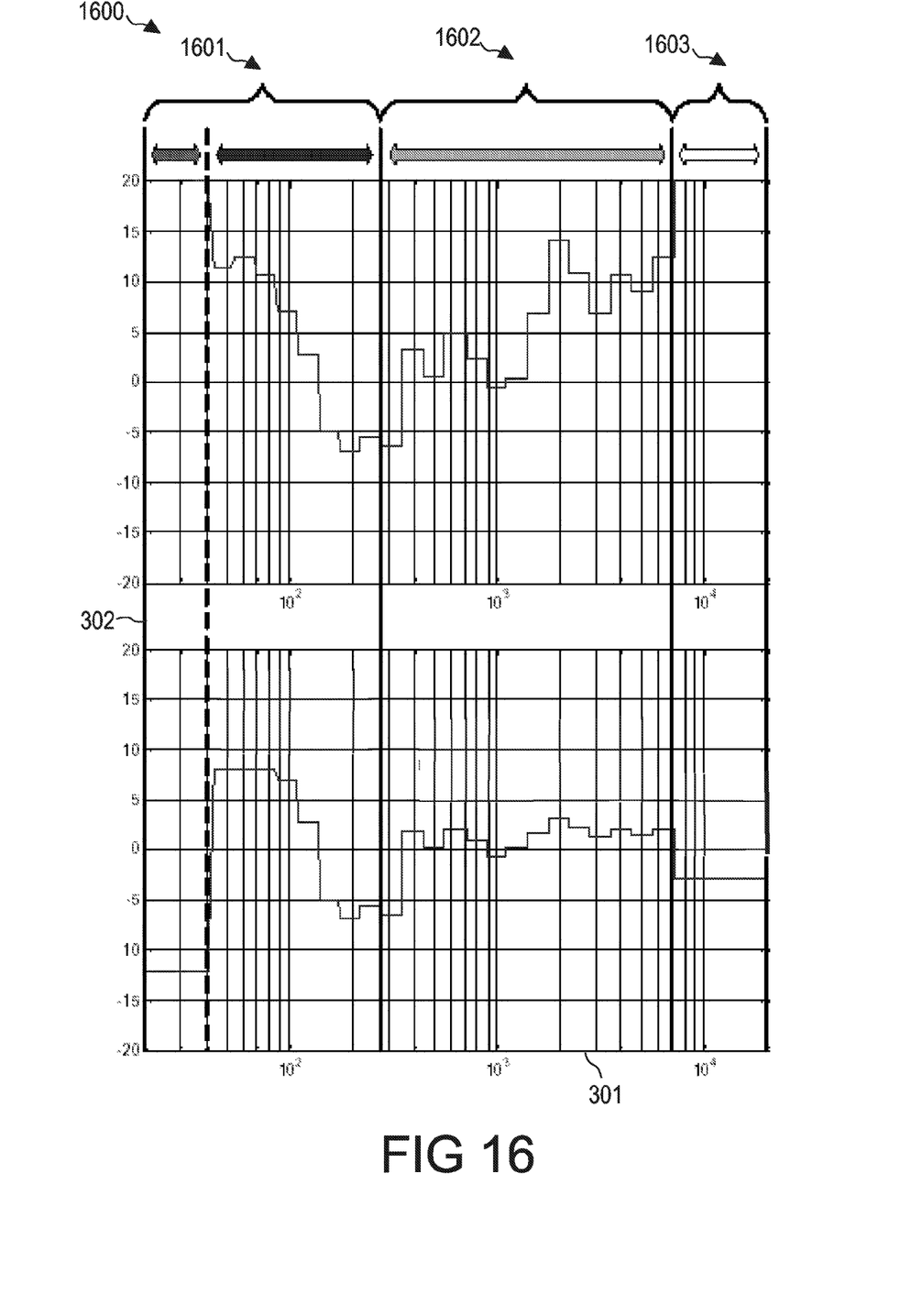
FIG. 16 illustrates a diagram of another embodiment of filter manipulations across various frequency ranges.

FIG. 16 shows a diagram 1600 giving an overview of the filter manipulations according to the described embodiment of the invention.

The frequency domain is divided into a bass domain 1601, a mid-range domain 1602 and a treble domain 1603. The bass domain 1601 is further divided into a very low-frequency region and a low-frequency region. Referring to the bass domain 1601, the very low-frequency region is cut (−12 dB). The low-frequency region is manipulated with a boost limit of maximally 8 dB. In the mid-range domain 1602, mid-range compression with linear scaling is performed. In the treble region 1603, the amplitudes are fixed to +3 dB for the front and −3 dB for the rear speakers of a car.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

The invention claimed is:

1. A device for processing audio data, wherein the device comprises:
  a scaling unit adapted to calculate a common scaling factor for scaling amplitudes of different frequency sub-components of a mid-frequency range component of the audio data; and
  a mid-frequency filter unit adapted to selectively filter the mid-frequency range component of the audio data in such a manner that the amplitudes of the different frequency sub-components of the mid-frequency range component of the audio data are scaled based on the common scaling factor from the scaling unit so that the scaled amplitudes reflect relations between the original amplitudes of the different frequency sub-components.

2. The device according to claim 1, wherein the mid-frequency filter unit is adapted to selectively filter the mid-frequency range component of the audio data in such a manner that the amplitudes of the different frequency sub-components of the mid-frequency range component of the audio data are downscaled.

3. The device according to claim 1, wherein the mid-frequency filter unit is adapted to selectively filter the mid-frequency range component of the audio data in such a manner that the amplitudes of ⅓ octave bands as the different frequency sub-components of the mid-frequency range component of the audio data are scaled so that the scaled amplitudes reflect relations between the original amplitudes of the ⅓ octave bands.

4. The device according to claim 1, wherein the mid-frequency filter unit is adapted to selectively filter the mid-frequency range component of the audio data in such a manner that the amplitudes of the different frequency sub-components of the mid-frequency range component of the audio data are scaled preserving proportions between the amplitudes of the different frequency subcomponents.

5. The device according to claim 1, wherein the scaling unit is adapted to calculate the common scaling factor for scaling the amplitudes of the different frequency sub-components of the mid-frequency range component of the audio data by estimating a maximum amplitude of the different frequency subcomponents and based on the estimated maximum amplitude and a predetermined threshold value indicating an upper amplitude limit.

6. The device according to claim 5, wherein the mid-frequency filter unit is adapted to selectively filter the mid-frequency range component of the audio data in such a manner that the amplitudes of all the different frequency sub-components of the mid-frequency range component of the audio data are downscaled in accordance with the calculated scaling factor.

7. The device according to claim 5, wherein the mid-frequency filter unit is adapted to selectively filter the mid-frequency range component of the audio data in such a manner that the amplitudes of the different frequency sub-components of the mid-frequency range component of the audio data are downscaled logarithmically in accordance with the calculated scaling factor.

8. The device according to claim 5, comprising a scaling factor adjustment unit adapted to adjust the calculated scaling factor for each of the different frequency sub-components individually.

9. The device according to claim 8, wherein the scaling factor adjustment unit is adapted to adjust the calculated scaling factor by linearly scaling the calculated scaling factor for the different frequency sub-components.

10. The device according to claim 8, wherein the scaling factor adjustment unit is adapted to adjust the calculated scaling factor so that the adapted scaling factor is higher for a first frequency sub-component than for a second frequency sub-component, wherein the first frequency sub-component includes higher frequencies than the second frequency sub-component.

11. The device according to claim 1, wherein the mid-frequency filter unit is adapted to selectively filter a component of the audio data in a frequency range between about 0.3 kHz and about 8 kHz as the mid-frequency range.

12. The device according to claim 1, comprising a high-frequency filter unit adapted to selectively filter a high-frequency range component of the audio data in such a manner that amplitudes of different frequency sub-components of the high-frequency range component of the audio data are fixed to a constant predetermined value.

13. The device according to claim 12, wherein the high-frequency filter unit adapted to selectively filter a component of the audio data in a frequency range above the mid-frequency range.

14. The device according to claim 1, comprising a very-low-frequency filter unit adapted to selectively filter a very-low-frequency range component of the audio data in such a manner that the very-low-frequency range component is cut.

15. The device according to claim 14, wherein the very-low-frequency filter unit is adapted to selectively filter a component of the audio data in a frequency range below about 0.04 kHz.

16. The device according to claim 1, comprising a low-frequency filter unit adapted to selectively filter a low-frequency range component of the audio data in such a manner that the low-frequency range component is conditioned in a manner that amplitudes not exceeding a predetermined maximum threshold remain unchanged; and amplitudes exceeding the predetermined maximum threshold are reduced to the maximum threshold.

17. The device according to claim 16, wherein the low-frequency filter unit is adapted to selectively filter a component of the audio data in a frequency range between a very-low-frequency range and the mid-frequency range.

18. The device according to claim 1, comprising a reproduction unit adapted for reproducing processed audio.

19. The device according to claim 1, realized as one of the group consisting of a vehicle audio system, a portable audio player, a portable video player, a head mounted display, a mobile phone, a DVD player, a CD player, a hard disk-based media player, an internet radio device, a public entertainment device, and an MP3player.

20. A method of processing audio data, wherein the method comprises:
    calculating a common scaling factor for scaling amplitudes of different frequency sub-components of a mid-frequency range component of the audio data; and
    selectively filtering the mid-frequency range component of the audio data in such a manner that the amplitudes of the different frequency sub-components of the mid-frequency range component of the audio data are scaled by the common scaling factor so that the scaled amplitudes reflect relations between the original amplitudes of the different frequency sub-components.

21. A computer-readable medium, in which a computer program of processing audio data is stored, which computer program, when being executed by a processor, is adapted to control or carry out operations comprising:
    calculating a common scaling factor for scaling amplitudes of different frequency sub-components of a mid-frequency range component of the audio data; and
    selectively filtering the mid-frequency range component of the audio data in such a manner that the amplitudes of the different frequency sub-components of the mid-frequency range component of the audio data are scaled by the common scaling factor so that the scaled amplitudes reflect relations between the original amplitudes of the different frequency sub-components.

22. A program element of processing audio data, which program element, when being executed by a processor, is adapted to control or carry out operations comprising:
   calculating a common scaling factor for scaling amplitudes of different frequency sub-components of a mid-frequency range component of the audio data; and
   selectively filtering the mid-frequency range component of the audio data in such a manner that the amplitudes of the different frequency sub-components of the mid-frequency range component of the audio data are scaled by a-the common scaling factor so that the scaled amplitudes reflect relations between the original amplitudes of the different frequency sub-components.

* * * * *